United States Patent [19]

Araki

[11] Patent Number: 5,288,363
[45] Date of Patent: Feb. 22, 1994

[54] AUTOMATIC CONTROL METHOD FOR GROWING SINGLE-CRYSTAL NECK PORTIONS

[75] Inventor: Kenji Araki, Annaka, Japan

[73] Assignee: Shin-Etsu Handotai Company, Ltd., Tokyo, Japan

[21] Appl. No.: 834,077

[22] Filed: Feb. 12, 1992

[30] Foreign Application Priority Data

Feb. 14, 1991 [JP] Japan .................................. 3-42640

[51] Int. Cl.$^5$ ............................................. C30B 15/22
[52] U.S. Cl. ..................... 156/601; 156/617.1; 422/249
[58] Field of Search ................. 156/601, 617.1; 422/105, 249

[56] References Cited

U.S. PATENT DOCUMENTS

| | | | |
|---|---|---|---|
| 3,692,499 | 9/1972 | Andrychuk | 422/249 |
| 3,958,129 | 5/1976 | Clement | 156/601 |
| 4,207,293 | 6/1980 | Scholl et al. | 422/249 |
| 4,617,173 | 10/1986 | Latka | 422/249 |
| 4,926,357 | 5/1990 | Katsuoka et al. | 156/601 |
| 5,089,238 | 2/1992 | Araki et al. | 156/601 |

FOREIGN PATENT DOCUMENTS 0294311 6/1987 European Pat. Off. .
0444628 9/1991 European Pat. Off. .
2071788 9/1971 France .

OTHER PUBLICATIONS

Patent Abstracts of Japan vol. 10, No. 23 (C-325) Jan. 29, 1986 & JP-A-60 176 989 (Toshiba K.K.) Sep. 11, 1985 *abstract*.
Patent Abstracts of Japan vol. 14, No. 505 (C-775) Nov. 5, 1990 & JP-A-2 208 280 (NEC Corp) Aug. 17, 1990 *abstract*.

Primary Examiner—Robert Kunemund
Attorney, Agent, or Firm—Browdy and Neimark

[57] ABSTRACT

The method automatically controls the growing of a single-crystal neck portion by the CZ method. The speed of pulling up the crystal is adjusted so that the crystal diameter control deviation becomes closer to zero. Combinations of the crystal diameter control deviation $\Delta D$ being large or small and the pulling-up speed V being high or low are employed as fuzzy inference conditions. According to such conditions, a correction value for the power supplied to a melt heater 18 is calculated, based on the fuzzy inference.

6 Claims, 8 Drawing Sheets

AUTOMATIC CONTROL METHOD FOR GROWING SINGLE-CRYSTAL NECK PORTIONS

BACKGROUND OF THE INVENTION

1. Field of the Invention

A present invention relates to an automatic control method for growing single-crystal neck portions by the CZ method.

2. Description of the Related Art

In single crystal growing devices employing the CZ method, an automatic control method has been developed for a process of growing the cone portion of a crystal, but manual control by a skilled worker is still required for a process of growing the neck portion, i.e. the process between the initiation of crystal growth and the growing of the cone portion. Because dislocations in the neck portion must be removed through the crystal surface, highly sophisticated control is required, for example, restricting the diameter of the growing crystal to a range of about 2 to 5 mm, pulling up the crystal at a relatively high speed, maintaining the absolute value of the diameter control deviation at about 0.5 mm or less, and growing the neck portion to a height more than ten times the diameter thereof. It is difficult even for an experienced worker to thoroughly remove dislocations from the crystal and to obtain a desired shape of the crystal during the processes of thinning and then thickening the crystal diameter. Usually, about 10% of the operations attempted by such workers result in failure. If the diameter of a growing crystal is thinned to be too small, a breakage may occur between the growing crystal and a melt at the interface therebetween to make it impossible to continue the growing thereof, or the growing portion may fail to acquire a strength sufficient to support a body portion which is grown afterwards. If the crystal diameter is too large, insufficient removal of dislocations may result, causing the existence of dislocations in the cone and body portions of the crystal and thus causing defected crystals to be produced.

SUMMARY OF THE INVENTION

It is an object of the present invention to solve the above-mentioned problems by providing an automatic control method for growing single-crystal neck portions by the CZ method.

If crystal diameter control for neck portions is performed by adjusting the speed of pulling up a crystal, such a type of automatic control method used for cone and body portions can be used for the neck portions. If crystal diameter control for neck portions is performed by adjusting the temperature of a liquid melt, such a type of automatic control method used for cone and body portions can not be used for neck portions. If it is used for neck portions, the diameter control deviation at the neck portions exceeds the acceptable diameter deviation thereof because the acceptable diameter deviation of neck portions is smaller than that of the cone and body portions and because response of the crystal diameter variation to the temperature variation of a melt is substantially slower than that to the speed variation of pulling up a crystal.

However, since the crystal diameter variation still depends on a change of the melt temperature, not only the pulling-up speed but also the melt temperature must be directly employed in the diameter control for neck portions by some means, to obtain a higher success rate of such control.

The present invention achieves such a target by employing the following method (b 1):

(1) A method for growing a crystal thin-neck portion between an initial point and a cone portion from a seed crystal by employing the CZ method in order to remove dislocations, comprising the steps of: adjusting the pulling-up speed of the seed crystal so that a control deviation of the crystal diameter becomes closer to zero; calculating a correction value for the amount of power supplied to a melt heater, based on fuzzy inference, according to fuzzy inference conditions which are combinations of the crystal diameter control deviation being large or small and the pulling-up speed being high or low; and correcting the power supplied to the heater, by using the correction value.

In conventional diameter control for a single-crystal body portion, PID control for the pulling-up speed and the melt temperature is performed so that the diameter control deviation becomes closer to zero. In a method according to the present invention, the power supplied to the heater is corrected, based on the pulling-up speed as well as on the diameter control deviation.

It is not easy to use the conventional PID control method in growing a single-crystal neck portion, because each constant in the PID control must be determined by trial and error. Even if the preferable constants in the PID control are once obtained, they have to be re-determined when conditions for the crystal growth vary even slightly.

According to the present invention, since a correction value for the power supplied to the melt heater is calculated on the basis of the fuzzy inference, according to the fuzzy inference conditions which are combinations of the crystal diameter control deviation being large or small and the pulling-up speed being high or low, and since the power supplied to the heater is corrected by using the correction value, the pulling-up speed can be easily employed as a factor in the diameter control, based on the same principle on which the diameter control deviation is employed as a factor therein. Also, because a skilled operator's knack can be easily incorporated in the fuzzy inference, the controlling parameters can be easily determined.

The fuzzy inference provides a correction value for the power supplied to the heater, according to its own rules, e.g. when the diameter control deviation is negative and large in its absolute value and the pulling-up speed is low, the power supplied to the heater is corrected with a negative correction value, and when the diameter control deviation is positive and large and the pulling-up speed is high, the power supplied to the heater is corrected with a positive correction value.

The lower the pulling-up speed, and the lower the power supplied to the heater, the larger the crystal diameter becomes. Therefore, when the diameter control deviation is negative and large in its absolute value and the pulling-up speed is low, the negative correction of the power supplied to the heater reduces the diameter control deviation. When the diameter control deviation is positive and large and the pulling-up speed is high, the positive correction of the power supplied to the heater also reduces the diameter control deviation. Thus, the crystal diameter becomes closer to a target value.

If a current actual correction value $\Delta P_1$ for the power supplied to the heater is calculated from a correction value $\Delta P_0$ for the power supplied to the heater currently obtained and the previous actual correction value $\Delta P_{1B}$ for the power supplied to the heater as:

$$\Delta P_1 = \Delta P_0 - \{1 - exp(-\tau/t)\}\Delta P_{1B} \quad (1)$$

where t is a time interval between the power corrections and $\tau$ is a time constant, overcorrection is avoided and, as a result, hunting of the diameter control deviation is reduced. This is because the current effect of the previous correction value $\{1-exp(-\tau/t)\}\Delta P_{1B}$ is subtracted from the current correction value $\Delta P_0$. The effect $\{1-exp(-\tau/t)\}\Delta P_{1B}$ works substantially on the current correction because of the relatively large value of the time constant $\tau$, i.e. about 10 minutes.

It is preferable to carry out the above method (1) after the following processing (2):

(2) The power supplied to the heater for heating a melt in the crucible is maintained at a constant level, and the seed crystal being in contact with the melt surface is pulled up at a constant speed for a predetermined time in order to grow a single crystal. After the predetermined time elapses, the pulling-up thereof is stopped, and the diameter of the bottom portion of the single crystal is measured. The amount of the power supplied to the heater is corrected according to a deviation of the measured diameter from a target value, and a target diameter pattern with respect to the length of the crystal is shifted in the direction of the length thereof. A certain amount of time is let to pass.

By the above processing, the initial temperature of the melt can be set at a proper value, and the target pattern of the crystal diameter can be corrected. Therefore, the effect of the method (1) is enhanced. In other words, if the power supplied to the heater varies less, the method (1) provides a better result of the diameter control.

DESCRIPTION OF THE PREFERRED EMBODIMENT

One embodiment of the present invention will be described hereinafter with reference to the drawings.

Figure 2:
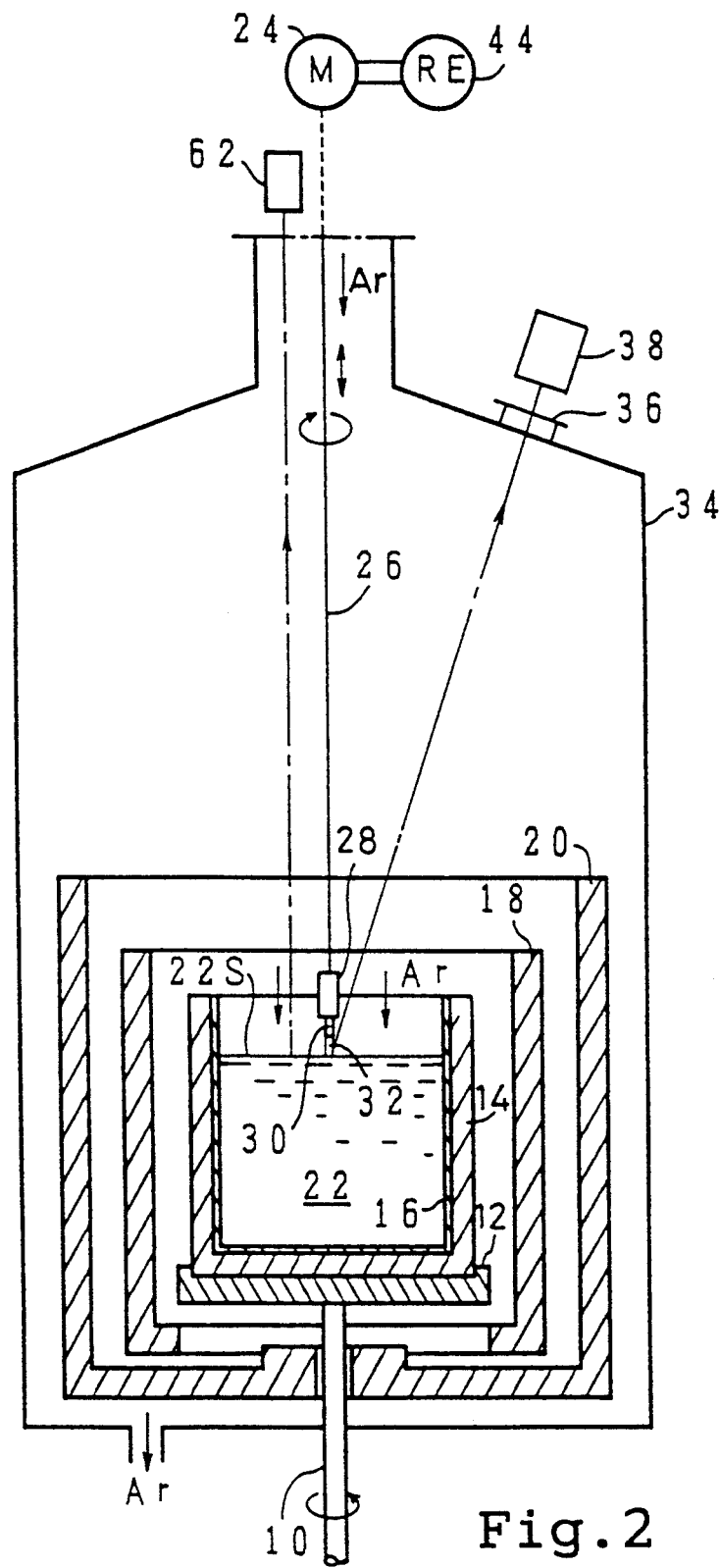
FIG. 2 is a schematic sectional view of an apparatus to which an automatic controlling device for growing single-crystal neck portions employing a method according to the present invention is applied.

Referring to FIG. 2, a graphite crucible 14 is mounted on a table 12 fixed on the top end of a shaft 10. A quartz crucible 16 is fitted in the graphite crucible 14. The graphite crucible 14 is surrounded by a heater 18 which is surrounded by a graphite heat-insulating member 20. When the heater 18 is supplied with electric power, a polycrystalline silicon ingot placed in the quartz crucible 16 becomes a melt 22.

A seed crystal 30 is connected by a seed holder 28 to the bottom end of a wire 26. The wire 26 is wound up or down by a motor 24 placed above the melt 22. When the bottom end of the seed crystal 30 is allowed to contact a surface 22S of the melt 22 and then the seed crystal 30 is pulled up, a silicon single crystal 32 grows from the tip of the seed crystal 30. Growing of the silicon is carried out in a chamber 34. Argon gas is blown down from an upper portion of the chamber 34 to purge the air inside the chamber 34. Because the argon gas is blown against the melt surface 22S and makes it wave, the diameter control for the neck portion of a single crystal having a small diameter becomes more difficult.

A CCD camera 38 for observing a diameter D of the bottom portion of the silicon single crystal 32 is placed above a window 36 provided at a shoulder portion of the chamber 34. The CCD camera 38 is positioned so that the optical axis thereof is directed to the center portion of the melt surface 22S. Video signals from the CCD camera 38 are sent to a diameter measuring unit 40 shown in FIG. 1. The diameter measuring unit 40 detects, by means of image processing, the diameter D of a fusion ring formed at the interface between the silicon single crystal 32 and the melt surface 22S, i.e. the diameter D of the bottom portion of the silicon single crystal 32. Since the diameter of the neck portion of the single silicon crystal 32 is small, the CCD camera has a great magnification ratio, e.g. one scanning line corresponding to 0.05 mm of real size, to increase the precision of the measurement.

Figure 1:
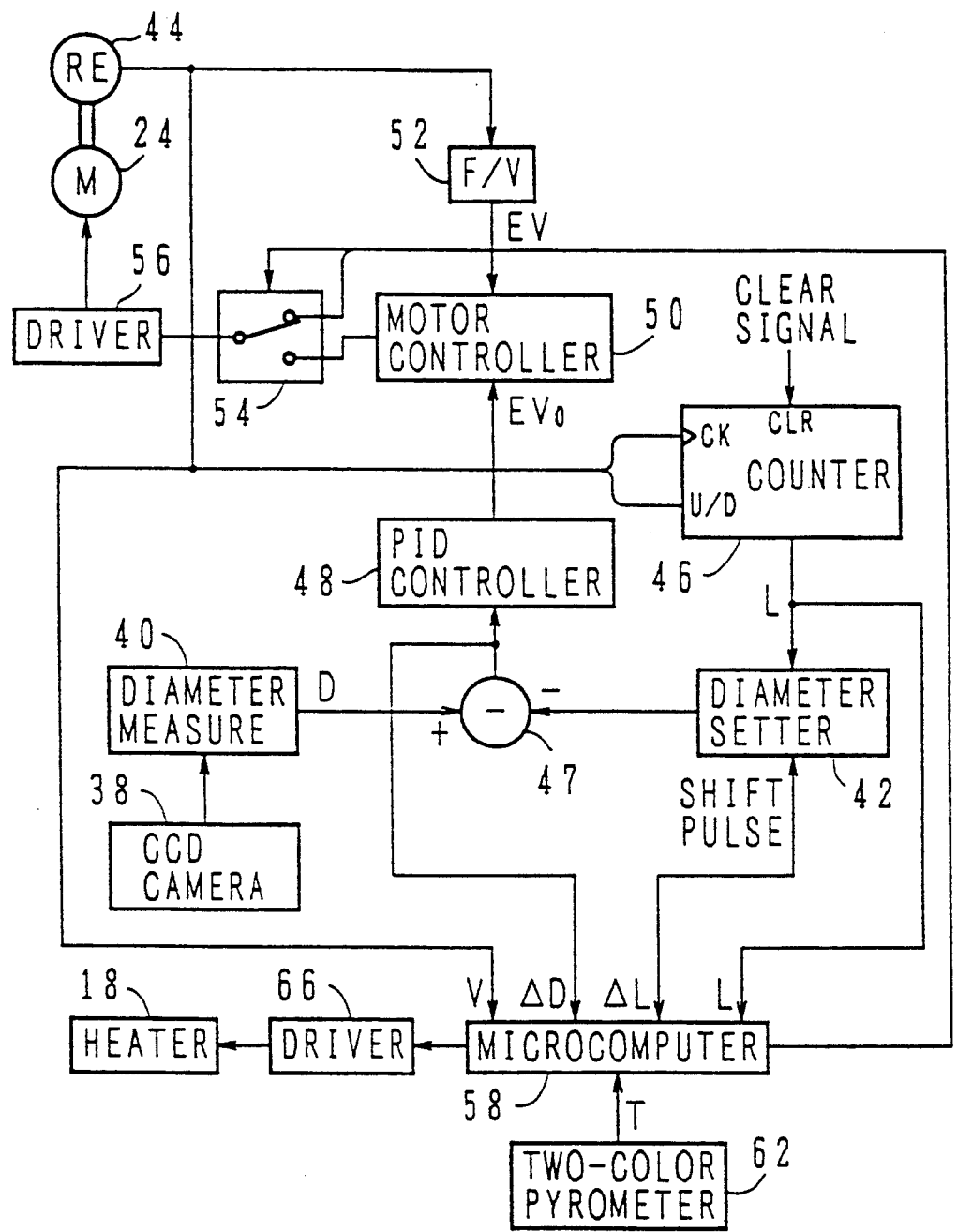
FIG. 1 is a block diagram of an automatic controlling device for growing single-crystal neck portions, the device employing a method according to the present invention.
Figure 6:
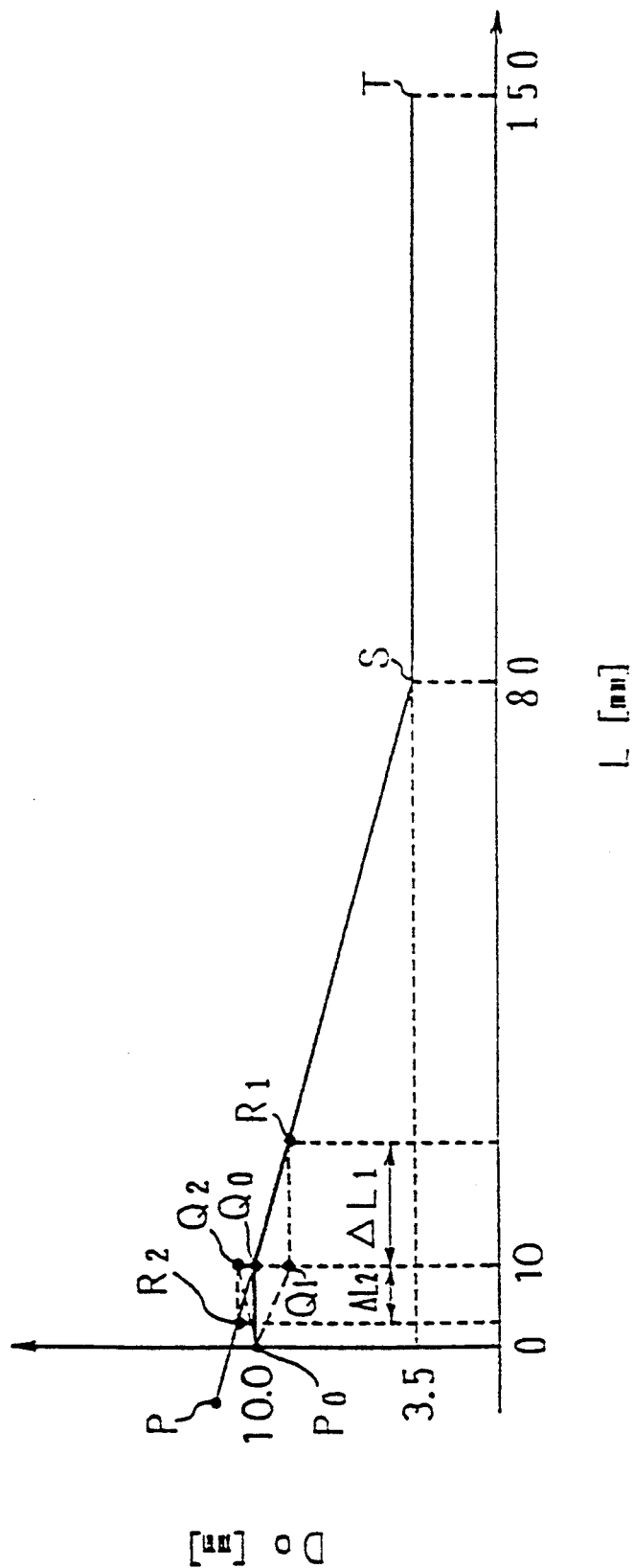
FIG. 6 is a graph showing the crystal diameter target pattern $D_0(L)$ determined by a diameter setting unit 42.

The target diameter is a function of a crystal length L, for example, as shown by a folded line $P_0Q_0ST$ in FIG. 6. A memory contained in the diameter measuring unit 42, however, stores target diameters $D_0(L)$ expressed by a folded line PST. The reason for this will be explained later. With reference to FIG. 1, a diameter setting unit 42 outputs a target diameter $D_0$ corresponding to a crystal length L inputted thereto. The crystal length L is obtained in the following way: a rotary encoder 44 whose rotational shaft is connected to a drive shaft of the motor 24 outputs pulses; and an up-down counter 46 counts the pulses for the crystal length L. A counted value of the up-down counter 46 is cleared when the seed crystal 30 is at the upper limit position and when the seed crystal 30 contacts the melt surface 22S. The incidence of contact is detected, e.g. by applying voltage between the wire 26 and the shaft 10 and by detecting a current which flows therebetween when the contact is made.

A single crystal growing apparatus according to the present invention performs cascade control of the wire pulling-up speed V so as to adjust a crystal diameter D as close to a target diameter $D_0$ as possible.

Data of a crystal diameter D and a target diameter $D_0$ are sent to a subtracter 47, which outputs a diameter control deviation $\Delta D = D - D_0$ to a PID controller 48. An output voltage $EV_0$ from the PID controller 48 is supplied to a variable-speed motor controller 50 as a target value of the rotational speed of the motor 24. On the other hand, an output from the rotary encoder 44 is converted by an F/V converter 52 to voltage EV proportional to the frequency. The voltage EV is supplied to the variable-speed motor controller 50 as a feed back amount. Usually, the variable-speed motor controller 50 is a PID controller. The variable-speed motor controller 50 controls the rotational speed of the motor 24, i.e. the pulling-up speed V of the wire 26, by way of a changing over switch 54 and a driver 56, so that the level of the voltage EV becomes closer to that of the output voltage $EV_0$. The changing over switch 54 selects either an output from the variable-speed motor controller 50 or an output from the a microcomputer 58 to send to the driver 56. The output from the microcomputer 58 is selected for the closed loop control by which the rotational speed of the motor 24 is maintained constant.

Although the diameter D of a crystal depends on the temperature of the melt 22 as well as on the pulling-up speed of the crystal, the response time of a change in the crystal diameter D to a change in the power supplied to the heater 18 is several ten times to several hundred times as long as the response time of a change in the crystal diameter D to a change in the crystal pulling-up speed. The growing time for the thin neck portion is short, and it is required that the diameter control deviation thereof be about as small as $+-0.5$ mm or smaller. Therefore, to employ the melt temperature to control the crystal diameter D of the neck portion, a special control method, different from the control method used for the cone and body portions, is needed. A single crystal growing apparatus according to the present invention has the below-described construction in which the power supplied to the heater 18 is controlled so that the diameter D of a crystal becomes closer to a target diameter $D_0$.

A two-color pyrometer 62 is provided for detecting the temperature of the melt surface 22S. Data of the melt surface temperature outputted by the two-color pyrometer 62 are sent to the microcomputer 58. The microcomputer 58 also receives data of the diameter control deviation $\Delta D$, the pulling-up speed V (since the pulling-up speed V is in inverse proportion to the frequency of the pulse from the rotary encoder 44, the speed V is calculated from the frequency measured by software), the crystal length L and a shift $\Delta L$, described later, outputted by the diameter setting unit 42.

Figure 3:
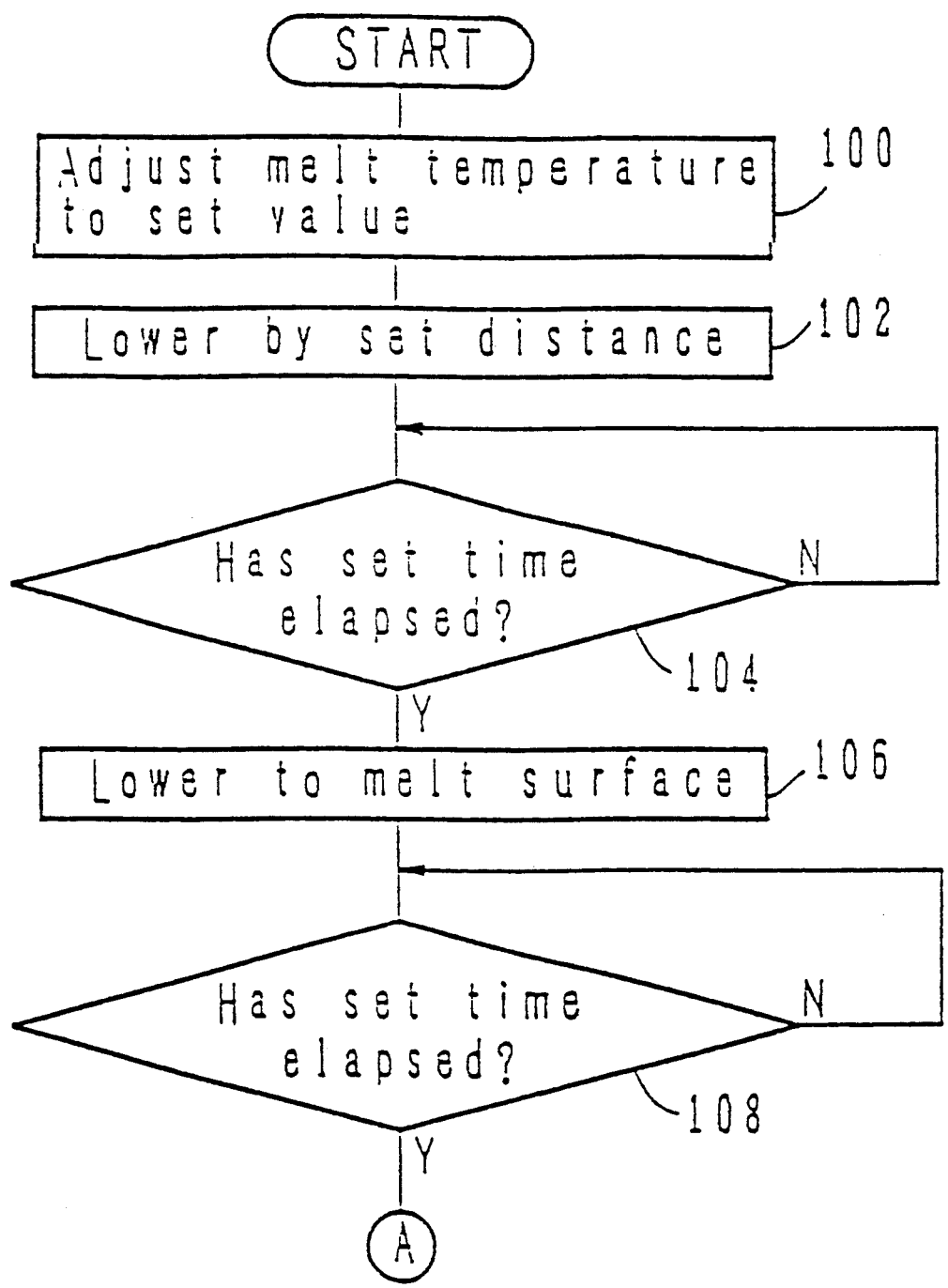
FIG. 3 is a flow chart, illustrating software of a microcomputer 58 shown in FIG. 1.
Figure 4:
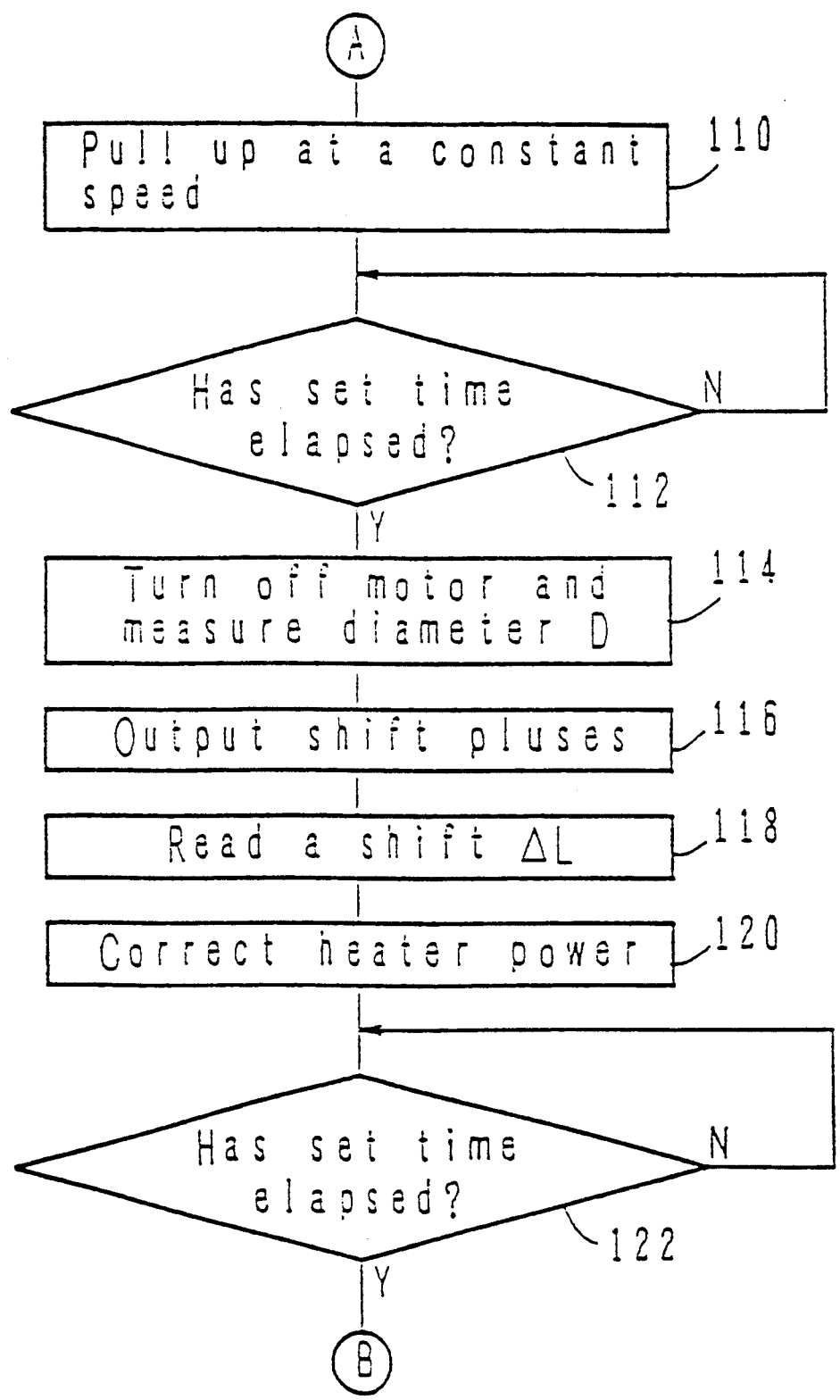
FIG. 4 is a flow chart, also illustrating software of the microcomputer 58 shown in FIG. 1.
Figure 5:
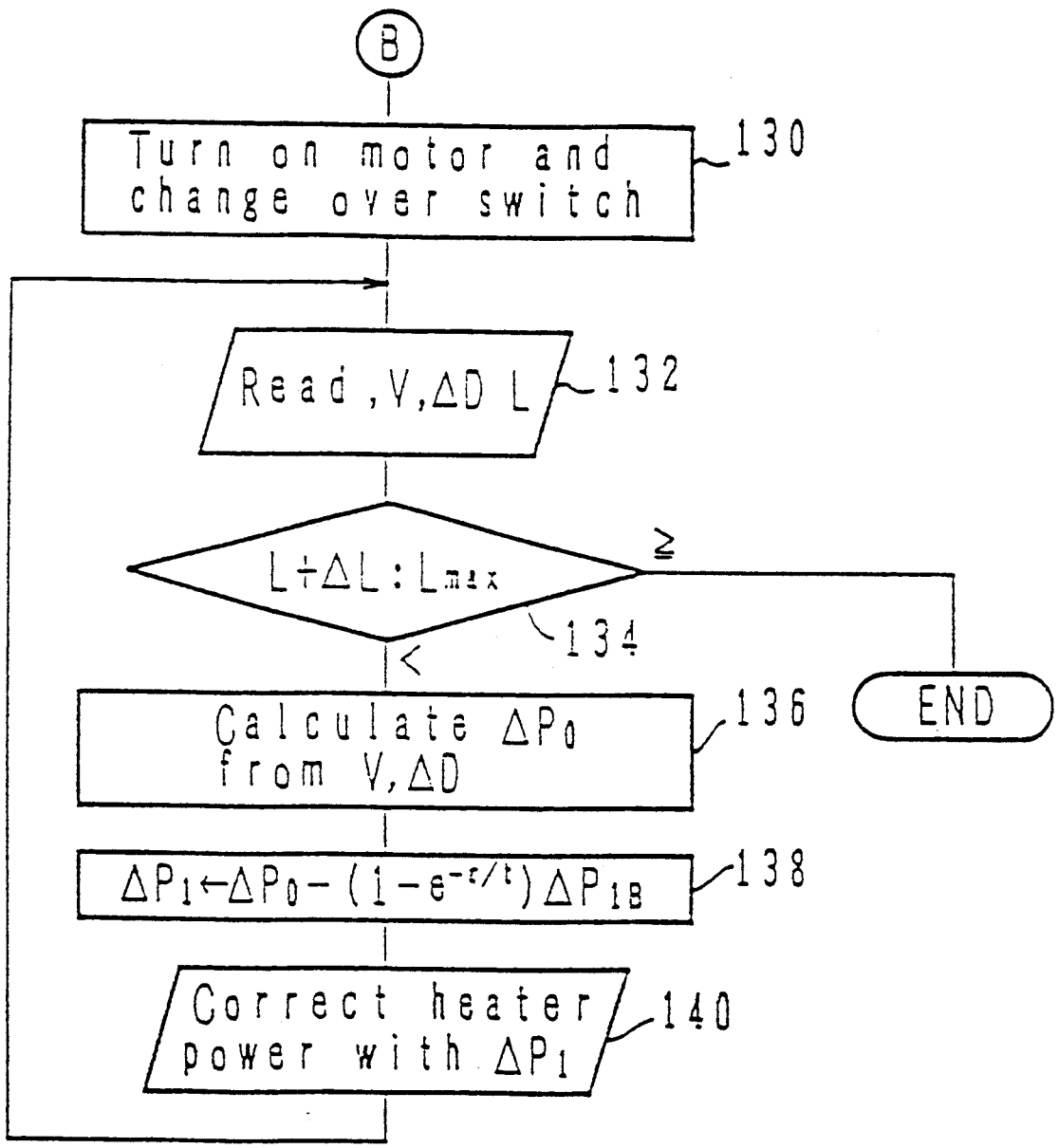
FIG. 5 is a flow chart, also illustrating software of the microcomputer 58 shown in FIG. 1.

With reference to FIGS. 3 to 5, a procedure of control by the microcomputer 58 for growing a single crystal neck portion will be described. The procedure is composed of processes (A) to (C) corresponding to FIGS. 3 to 5.

(A) Control Procedure up to Initiation of the Pulling-Up (100) The seed crystal 30 is at the upper limit position. The melt surface temperature T is read from the two-color pyrometer 62. The microcomputer 58 supplies power through the driver 66 to the heater 18 so that the melt surface temperature T becomes equal to an initial set temperature. The initial set temperature is determined, based on experience, so that, for example, when the seed crystal 30 is pulled up at a constant speed of 2 mm/min., the diameter of a silicon single crystal 32 is maintained equal to the diameter of the seed crystal, e.g. 10 mm (a line $P_0Q_0$ in the FIG. 6).

(102) A line from the microcomputer 58 is selected at the changing over switch 54. The motor 24 is switched on to wind out the wire 26 at a constant speed, and switched off a little before the bottom end of the seed crystal 30 contacts the melt surface 22S. The seed crystal 30 is stopped when a count value of the up-down counter 46 becomes equal to a set value.

(104) For pre-heating the seed crystal 30, a predetermined time, e.g. seven minutes, is let to pass.

(106) The motor 24 is switched on to lower the seed crystal until the bottom end thereof contacts the melt 22.

(108) For achieving thorough contact of the bottom end of the seed crystal 30 and the melt surface 22S, the seed crystal 30 is left there for a predetermined time, e.g. five minutes.

These steps 100 to 108 are a known procedure.

(B) Pulling Up at a Constant Speed (110) The motor 24 is switched on to pull up the seed crystal 30 at a constant speed, e.g. 2 mm/min.

(112) To see to it that the temperature of the melt 22 is appropriate, the motor 24 is left on for a predetermined time, e.g. five minutes; in other words, until the crystal length L reaches $L_0$, e.g. 10 mm (see FIG. 6).

(114) The motor 24 is switched off. The crystal diameter D is read from the diameter measuring unit 40. If the initial set temperature is proper, the crystal diameter D stays constant as shown by the line $P_0Q_0$ in FIG. 6. If it is not proper, the crystal diameter D varies as shown by a line $P_0Q_1$ or a line $P_0Q_2$.

(116) Shift pulses are sent to the diameter setting unit 42. Responding to the pulses, the diameter setting unit 42 shifts the target diameter pattern $D_0(L)$ by $\Delta L$ parallel to the L axis so as to satisfy an equation $D_0(L+\Delta L) = D$. For example, when the crystal diameter D varies as shown by the line $P_0Q_1$, the target diameter pattern $D_0(L)$ is shifted by $\Delta L_1$ parallel to the L axis, so that a point $Q_1$ coincides with a point $R_1$. When the crystal diameter D varies as shown by the line $P_0Q_2$, the target diameter pattern $D_0(L)$ is shifted by $\Delta L_2$ parallel to the L axis, so that a point $Q_2$ coincides with a point $R_2$.

(118) The shift $\Delta L$ is read from the diameter setting unit 42.

(120) A correction value $\Delta P$ for the power supplied to the heater 18 is calculated according to a difference $D-D_0$. The amount of power is varied by the correction value $\Delta P$. A correction value $\Delta P$ is obtained from the following equation:

$$\Delta P = K(D - D_0(L_0)) \qquad (2)$$

where K is a constant.

(122) For stabilizing the temperature of the melt 22, a predetermined time, e.g. five minutes, is let to pass before going on to the next procedure.

By the above processing, a proper initial temperature of the melt 22S can be achieved. Also, since the target pattern $D_0$ of the crystal diameter D can be corrected, the precision of the diameter control of a neck portion described below can be improved.

(C) Neck portion Diameter control (130) The motor 24 is switched on. The variable-speed motor controller 50 is selected by the changing over switch 54. The speed of pulling up the wire 26 is controlled by PID operation together with the following operation.

(132) The pulling-up speed V, the diameter control deviation ΔD and the crystal length L are read.

(134) When $L+\Delta L \leq L_{max}$, the neck portion diameter control is completed, and the corn portion diameter control (not shown) is started. When $L+\Delta L < L_{max}$, the procedure goes on to the step 136.

(136) A correction value $\Delta P_0$ is calculated from the pulling-up speed V and the diameter control deviation ΔD, according to the fuzzy inference as described later. The correction value $\Delta P_0$ does not include an effect which the previous actual correction value $\Delta P_{1B}$ currently has.

(138) An actual correction value $\Delta P_1$ is calculated through the foregoing equation (1). Correcting the power supplied to the heater with the correction value $\Delta P_1$ avoids overcorrection and, as a result, reduces hunting of the diameter control deviation. This is because the current effect of the previous correction value $\{1-\exp(-\tau/t)\}\Delta P_{1B}$ is subtracted from the current correction value $\Delta P_0$. The effect $\{1-\exp(-\tau/t)\}\Delta P_{1B}$ works substantially on the current correction because of the relatively large value of the time constant $\tau$, i.e. about 10 minutes.

(140) The level of the power supplied to the heater 18 is varied by $\Delta P_1$. The procedure returns to the step 132.

The processing at the step 136 will be described in detail below.

Figure 7A:
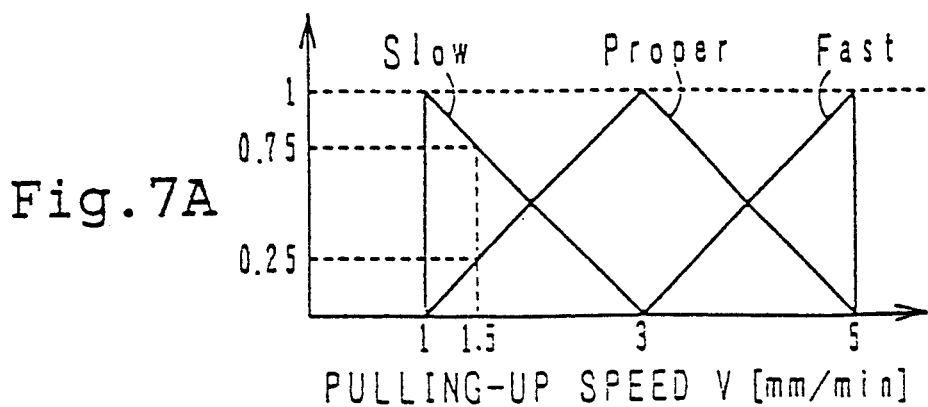
FIG. 7A is a graph showing three membership functions of the pulling-up speed V: proper, slow, and fast.
Figure 7B:
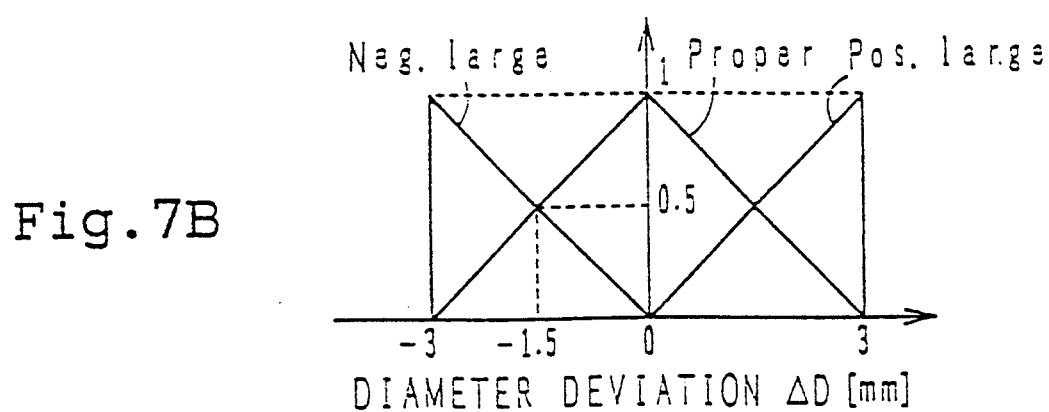
FIG. 7B is a graph showing three membership functions of the diameter control deviation $\Delta D$: proper; negative and large in absolute value (neg. large); and positive and large (pos. large).

As shown in FIG. 7B, three membership functions are employed, of the diameter control deviation ΔD: proper; negative and large in absolute value (neg. large); and positive and large (pos. large). The control deviation is supposed to be limited within a range of $+-3$ mm.

Similarly, as shown in FIG. 7A, three membership functions are employed, of the pulling-up speed V: proper, slow and fast. The pulling-up speed is restricted within a range of 1 to 5 mm/sec according to this embodiment.

Figure 7C:
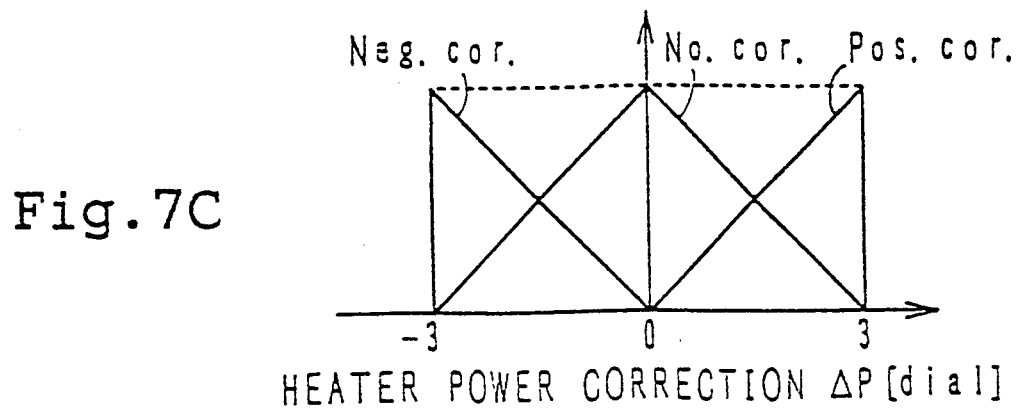
FIG. 7C is a graph showing three membership functions of the power correction value $\Delta P$: no correction is needed (no cor.); negative correction is needed (neg. cor.); and positive correction is needed (pos. cor.).

Similarly, as shown in FIG. 7C, three membership functions of the power correction value ΔP are employed: no correction is needed (no cor.); negative correction is needed (neg. cor.); and positive correction is needed (pos. cor.). The power correction is performed in a range corresponding to a range of −3 to 3 of a scale of a power correction dial which is used in manual operation.

The lower the pulling-up speed V, and the smaller the power supplied to the heater P, the larger the crystal diameter D becomes. A fuzzy controlling rule as shown in Table 1 is applied among the above membership functions. When the diameter control deviation ΔD is negative and large in absolute value and the pulling-up speed V is low (such a condition is expressed as "(ΔD:neg.large) AND (V:slow)" hereinafter, other conditions being expressed in the same manner), negative correction is performed. When the diameter control deviation ΔD is positive and large and the pulling-up speed V is high, positive correction is performed. In the other conditions, no correction is performed.

(TABLE 1)

| (ΔD) | (V) | | |
|---|---|---|---|
| | SLOW | PROPER | FAST |
| NEG. LARGE | Neg. cor. | No cor. | No cor. |
| PROPER | No cor. | No cor. | No cor. |

(TABLE 1)-continued

| (ΔD) | (V) | | |
|---|---|---|---|
| | SLOW | PROPER | FAST |
| POS. LARGE | No cor. | No cor. | Pos. cor. |

For example, when $\Delta D = -1.5$ mm, $V = 1.5$ mm/sec, a power correction value $\Delta P_0$ is obtained from FIGS. 7A to 7C and 8A to 8C as described below.

Figure 8A:
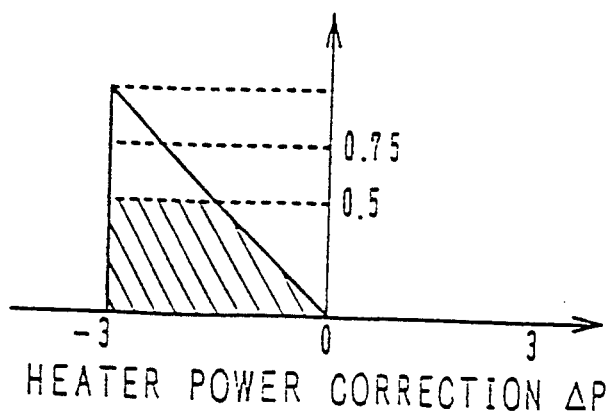
FIGS. 8A, 8B and 8C are graphs illustrating calculations for the power correction based on a fuzzy inference rule.

As for negative power correction,
(ΔD:neg.large) AND (V:slow)=0.5 AND 0.75=0.5
is obtained, and thus, the area shadowed by slanted lines in FIG. 8A is determined.

As for positive power correction,
(ΔD:pos.large) AND (V:fast)=0 AND 0=0 is obtained and is thus ignored.

As for no correction needed, (ΔD:neg.large) AND (V:proper)=0.5 AND 0.25=0.25

(ΔD:neg.large) AND (V:fast)=0.5 AND 0=0

(ΔD:proper) AND (V:slow)=0.5 AND 0.75=0.5

(ΔD:proper) AND (V:proper)=0.5 AND 0.25=0.25

(ΔD:proper) AND (V:fast)=0.5 AND 0=0

(ΔD:pos. large) AND (V:slow)=0 AND 0.75=0

(ΔD:pos. large) AND (V:proper)=0 AND 0.25=0 are obtained. The maximum value 0.5 is employed, and thus, the area shadowed by slanted lines in FIG. 8B is determined.

Figure 8B:
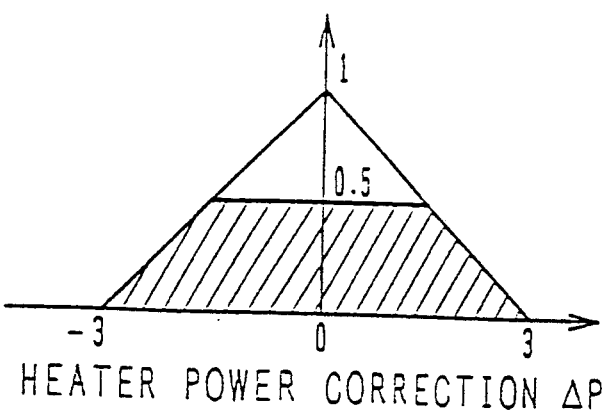
Figure 8C:
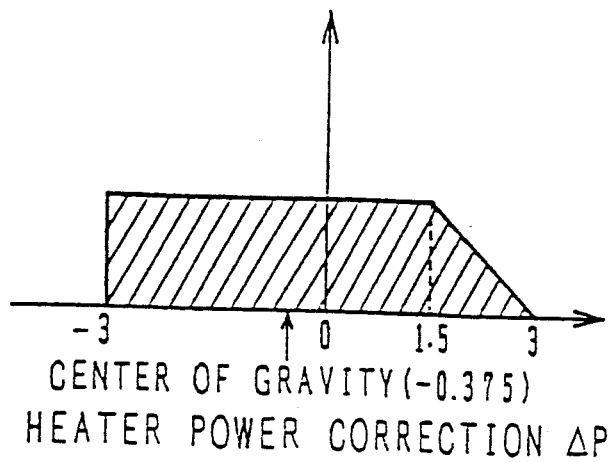

The logical sum of the areas shown in FIG. 8A and FIG. 8B is obtained as shown in FIG. 8C. The center value of the area as shown in FIG. 8C (the position of a vertical line which divides the area equally into the right and left-side parts) is used as the power correction value $\Delta P_0$, i.e. −0.375 in this case. Thus, the correction value $\Delta P_0$ is obtained as −0.375 when the no correction needed as well as the negative correction is considered, whereas it is obtained as −1.83, i.e. the position of a center of the shadowed area in FIG. 8A, when the negative correction alone is considered.

With the fuzzy controlling as described above, the pulling-up speed can be easily employed in the diameter control, by handling it substantially equally to the diameter control deviation on the basis of a common idea. Also, determination of the controlling parameters (shapes of the membership functions and the fuzzy inference rule) is easier than that of a controlling constant in PID control.

The effects of this embodiment will be described with actual figures.

A success in growing a crystal neck portion theoretically means obtaining a crystal neck portion having no dislocation. Whether or not a crystal can be made free from dislocations depends not only on the shape of the crystal but on other conditions. However, since this embodiment performs the diameter control, the effects thereof should be judged, based solely on the crystal shape. Therefore, in the description below, a success in controlling the growth of a crystal neck portion means obtaining a crystal whose diameter is in a range from 2.5 to 4 mm and whose length is not less than 10 mm.

(A) Control for growing crystal neck portions was performed on twenty seed crystals 30, in which all the steps shown in FIG. 3, the steps 110 to 114, 120 and 122 shown in FIG. 4, and the step 130 shown in FIG. 5 were carried out before the power supplied to the heater was adjusted to a constant level. The success rate was 45% (9 successes).

(B) Control for growing crystal neck portions was performed on twenty seed crystals 30, in which all the steps shown in FIG. 3, the steps 110 to 114, 120 and 122 shown in FIG. 4, and the steps 130 to 136, and 140 shown in FIG. 5 were carried out. The success rate was 55% (11 successes).

(C) Control for growing crystal neck portions was performed on twenty seed crystals 30, in which all the steps shown in FIGS. 3, 4 and 5 were carried out. The success rate was 80% (16 successes). The success rate substantially higher than that in the case (B) was obtained because the steps 116 and 118 shown in FIG. 4, and the step 138 shown in FIG. 5, which were skipped in the case (B), were carried out. The effect of the steps 116 and 118 is considered to be larger than that of the step 138.

The present invention is intended to cover various modifications. For example, instead of the membership functions whose shape is a triangle according to the above embodiment, a curve such as Gaussian distribution may be employed. Although the fuzzy inference rule shown in Table 1 is preferable, it does not restrict the present invention. The present invention is characterized in that a fuzzy controlling is performed for correction of the power supplied to the heater and that the pulling-up speed is employed as a factor in the fuzzy controlling. Similarly, the above calculation method (FIGS. 8A to 8C), i.e. a min-max method, according to the fuzzy inference rule does not restrict the present invention.

What is claimed is:

1. An automatic control method for growing a single-crystal neck portion between an initial point and a cone portion by employing the CZ method in order to remove dislocation, said automatic control method comprising the steps of:
    adjusting the pulling-up speed of the seed crystal so that a control deviation of the crystal diameter becomes closer to zero;
    calculating a correction value for the amount of power supplied to a melt heater, based on fuzzy inference, according to fuzzy inference conditions which are combinations of the crystal diameter control deviation ($\Delta D$) being large or small and the pulling-up speed (V) being high or low; and
    correcting the power supplied to the heater, by using the correction value.

2. An automatic control method according to claim 1, wherein said fuzzy inference provides a correction value for said power supplied to the heater, wherein when said diameter control deviation is negative and large in its absolute value and said pulling-up speed is low, said power supplied to the heater is corrected with a negative correction value, and when said diameter control deviation is positive and large and said pulling-up speed is high, said power supplied to the heater is corrected with a positive correction value.

3. An automatic control method according to claim 2, wherein a current actual correction value $\Delta P_1$ for said power supplied to the heater is calculated from a correction value $\Delta P_0$ for the power supplied to the heater currently obtained and the previous actual correction value $\Delta P_{1B}$ for the power supplied to the heater as:

$$\Delta P_1 = \Delta P_0 - \{1 - exp(-\tau/t)\}\Delta P_{1B}$$

where t is a time interval between the power corrections and $\tau$ is a time constant.

4. An automatic control method for growing a single crystal neck portion between an initial point and a cone portion, wherein said method according to claim 1 is performed after the following steps:
    controlling the power supplied to the heater for heating a melt in a crucible at a constant, and pulling up a seed crystal in contact with the melt surface at a constant speed to begin growing a single crystal;
    After the single crystal begins growing, stopping the pulling-up thereof, and measuring the diameter of the bottom portion of the single crystal;
    correcting the amount of the power supplied to the heater according to a deviation of the measured diameter from a target value, and shifting a target diameter pattern with respect to the length of the crystal in the longitudinal direction thereof so that the deviation becomes closer to zero; and
    pulling up the single crystal.

5. An automatic control method for growing a single crystal neck portion between an initial point and a cone portion, wherein said method according to claim 2 is performed after the following steps:
    controlling the power supplied to the heater for heating a melt in a crucible at a constant, and pulling up a seed crystal in contact with the melt surface at a constant speed to begin growing a single crystal;
    After the single crystal begins growing, stopping the pulling-up thereof, and measuring the diameter of the bottom portion of the single crystal;
    correcting the amount of the power supplied to the heater according to a deviation of the measured diameter from a target value. and shifting a target diameter pattern with respect to the length of the crystal in the longitudinal direction thereof so that the deviation becomes closer to zero; and
    pulling up the single crystal.

6. An automatic control method for growing a single crystal neck portion between an initial point and a cone portion, wherein said method according to claim 3 is performed after the following steps:
    controlling the power supplied to the heater for heating a melt in a crucible at a constant, and pulling up a seed crystal in contact with the melt surface at a constant speed to begin growing a single crystal;
    After the single crystal begins growing, stopping the pulling-up thereof, and measuring the diameter of the bottom portion of the single crystal;
    correcting the amount of the power supplied to the heater according to a deviation of the measured diameter from a target value. and shifting a target diameter pattern with respect to the length of the crystal in the longitudinal direction thereof so that the deviation becomes closer to zero; and
    pulling up the single crystal.

* * * * *